United States Patent
Chen

(10) Patent No.: US 10,304,537 B1
(45) Date of Patent: May 28, 2019

(54) METHOD FOR INDICATING PROGRAM STATE OF WORDLINE IN NAND FLASH MEMORY

(71) Applicant: SHINE BRIGHT TECHNOLOGY LIMITED, Hongkong (CN)

(72) Inventor: Minyi Chen, San Jose, CA (US)

(73) Assignee: GIGADEVICE SEMICONDUCTOR (BEIJING) INC., Beijing (CN)

( * ) Notice: Subject to any disclaimer, the term of this patent is extended or adjusted under 35 U.S.C. 154(b) by 0 days.

(21) Appl. No.: 15/864,045

(22) Filed: Jan. 8, 2018

(51) Int. Cl.
  *G11C 16/04* (2006.01)
  *G11C 16/16* (2006.01)
  *G11C 16/34* (2006.01)
(52) U.S. Cl.
  CPC .............. *G11C 16/04* (2013.01); *G11C 16/16* (2013.01); *G11C 16/3427* (2013.01)
(58) Field of Classification Search
  CPC ..................... G11C 16/3427; G11C 16/16
  See application file for complete search history.

(56) References Cited

U.S. PATENT DOCUMENTS

| | | | | |
|---|---|---|---|---|
| 5,504,760 A | * | 4/1996 | Harari | G11C 16/10 365/190 |
| 2014/0053041 A1 | * | 2/2014 | Sakaue | H03M 13/2909 714/758 |
| 2014/0160866 A1 | * | 6/2014 | Shur | G11C 13/0002 365/189.011 |
| 2017/0017546 A1 | * | 1/2017 | Qidwai | G11C 29/52 |

* cited by examiner

*Primary Examiner* — Ajay Ojha
(74) *Attorney, Agent, or Firm* — Gokalp Bayramoglu

(57) ABSTRACT

The present application provides a NAND flash memory and a method for indicating program status of wordline in a NAND flash memory, the NAND flash memory comprises: a wordline including a plurality of columns, the columns include NOP columns, which are used to store NOP bytes, one of the NOP bytes is programmed after the wordline is programmed for one time. The method includes: performing program operation to a wordline; and after the wordline is programmed for one time, programming one of NOP bytes; if all the NOP bytes are programmed, outputting a NOP status. The present application could effectively prevent the error occurs due to over-time programming the same wordline.

7 Claims, 2 Drawing Sheets

METHOD FOR INDICATING PROGRAM STATE OF WORDLINE IN NAND FLASH MEMORY

TECHNICAL FIELD

The present application generally relates to the NAND flash memory technical field and, more particularly, to a method for indicating program state of wordline in NAND flash memory and the NAND flash memory thereof.

BACKGROUND OF THE INVENTION

Flash memory is an electronic (solid-state) non-volatile computer storage medium that can be electrically erased and reprogrammed. The NAND flash memory is a main type of flash memory named after the NAND logic gates, it has advantages of fast programming and short erasing time.

The NAND flash array is composed of a plurality of memory cells. Each memory cell stores a binary code 0 or 1. Several memory cells form a "word". An address decoder of the NAND flash array includes n address output lines A0~An−1 and 2n decoder output lines W0~W2n−1. The decoder output line Wi is called a "wordline" and corresponds to a word in the storage array.

The wordline needs to be programmed during operation. In NAND flash datasheet, the maximum Number of Program (NOP) in a SLC wordline is 4 while in a MLC page is 1. That is, the SLC wordline may be programmed four times at most. If the wordline is programmed for more than four times, the data stored in the wordline may have error due to repeated program.

FIG. 1 is a schematic diagram showing the column architecture in the conventional technology. As shown in FIG. 1, in the column architecture, the columns include a main column which occupies 8 KB or 16 KB, an error correcting code (FCC) column which occupies 1 KB, and a redundant column which occupies 512B.

The main column stores normal data, the ECC column stores the error correcting code, and the redundant column stores the redundant characters. When in a user mode, the user may operate the main column and the ECC column, but he or she cannot operate the redundant column. When in a test mode, the operator can operate the main column, the ECC column and the redundant column.

Inside NAND flash design, however, there is no way limit end users to program a wordline several times. Therefore, it is problem that error may occur in the wordline due to over-time program.

SUMMARY OF THE INVENTION

Therefore, an object of the present invention is to provide a NAND flash memory and a status output method in NAND flash memory, which may overcome or at least partially solve or mitigate above mentioned problems.

Another object of the present invention is to provide a method to limit end users to program a wordline by counting the program numbers, in order to prevent the error occurred due to over-time programming the same wordline.

To achieve these and other advantages and in accordance with the purpose of the present disclosure, as embodied and broadly described herein. The present disclosure provides A NAND flash memory comprising a wordline comprising a plurality of columns; wherein the plurality of columns comprises a plurality of NOP columns, which are used to store a plurality of NOP bytes; and wherein one of the plurality of NOP bytes is programmed after the wordline is programmed for one time.

The present disclosure further provides a method for indicating program state of a wordline, comprising: performing program operation to a wordline; pro ramming one of a plurality of NOP bytes after the wordline is programmed for one time; outputting a NOP status in case that all the plurality of NOP bytes are programmed.

The above description is merely an overview of technical solutions of the present application. It is understood that to more clearly understand the technical solutions of the present application to implement in accordance with the contents of the description, and to make the foregoing and other objects, features and advantages of the application more apparent, detailed embodiments of the application will be provided below.

BRIEF DESCRIPTION OF THE DRAWINGS

Through reading the detailed description of the following preferred embodiments, various other advantages and benefits will become apparent to those of ordinary skills in the art. Accompanying drawings are merely included for the purpose of illustrating the one of embodiments and should not be considered as limiting of the application. Further, throughout the drawings, same elements are indicated by same reference numbers.

DETAILED DESCRIPTION OF THE INVENTION

Exemplary embodiments of the present application will be described in detail with reference to the accompanying drawings hereinafter.

Figure 1:
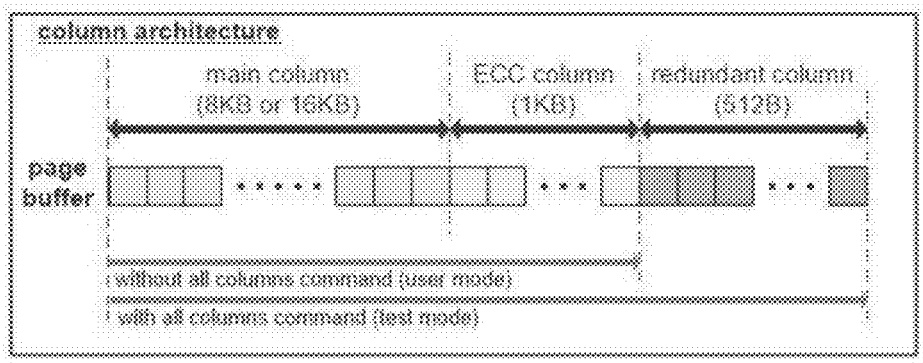
FIG. 1 is a schematic diagram showing the column architecture in the conventional technology.
Figure 2:
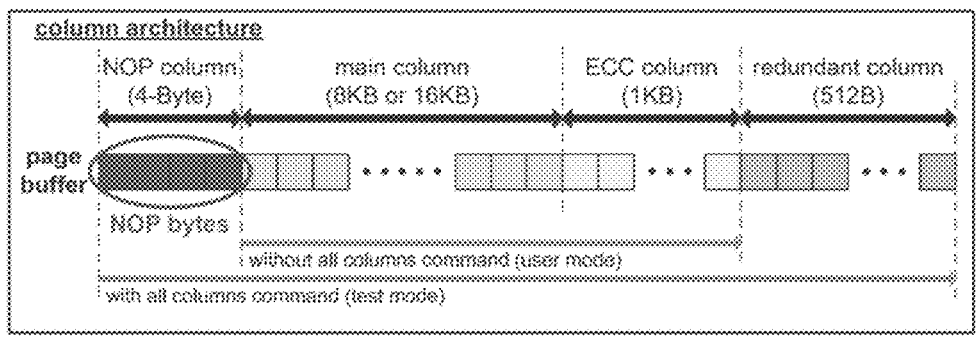
FIG. 2 is a schematic diagram showing the column architecture in a first embodiment of the present invention.

Referring to FIG. 2, it is a schematic diagram showing the column architecture according to an embodiment of the present invention. As shown in FIG. 2, compared with the conventional technology, the columns further include tour-byte columns for storing NOP bytes. The four-byte column may be called NOP columns, which is particularly used for storing the NOP bytes. The NOP columns may be selected from the main columns or the ECC columns.

Figure 3:
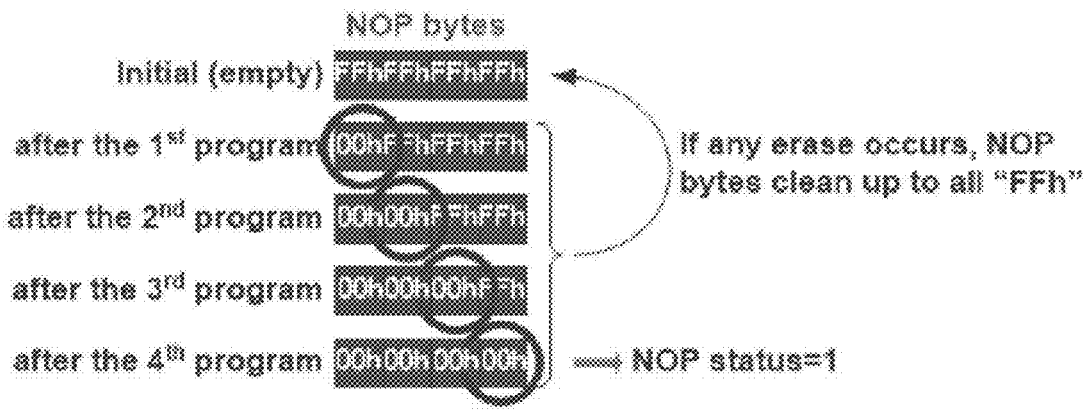
FIG. 3 is a schematic diagram showing the relation between the program number and the NOP status according to an embodiment of the present invention.

Referring to FIG. 3, it is a schematic diagram showing the relation between the program number and the NOP status according to an embodiment of the present invention. As shown in FIG. 3, it is capable to use a NOP status to reflect whether the wordline can be programmed. The NOP status may be 0 or 1. In an embodiment, for example, the four-bytes column of the NOP status is set on "1111" initially, that is, all 1 status. After the first-time program, the first byte in the NOP bytes is changed from 1 to 0. After the second-time program, the second byte in the NOP bytes is changed from 1 to 0. After the third-time program, the third byte in the NOP bytes is changed from 1 to 0, and after the fourth-time program, the fourth byte in the NOP bytes is changed from 1 to 0. After four times program, the wordline cannot be programmed anymore, so the NOP status is changed to 1 from 0.

Please be noted that, as a special case, if any erase occurs, all the NOP bytes are cleaned up to 1.

Table 1 hereinbelow shows the NOP, operation and the status according to an embodiment of the present invention. As shown in Table 1, when data in the four columns are all 1, it means the wordline has not been programmed, or an erase operation is just performed. When the data in the first column is 0, and the rest three columns are 1, it means the wordline is been programmed once, the NOP is 1. When the data in the first and second columns are 0, and the rest two columns are 1, it means the wordline is been programmed twice, the NOP is 2. When the data in the first three columns are 0, and the rest one columns are 1, it means the wordline is been programmed three times, the NOP is 3. When the data in the four columns are 0, it means the wordline is been programmed four times, and the wordline cannot programmed. When the NOP is four, the NOP status is 1, and in the previous three cases (the NOP is 0, 1, 2 or 3), the NOP status is 0.

TABLE 1

|  | [0] | [1] | [2] | [3] | NOP | operation | status |
|---|---|---|---|---|---|---|---|
| NOP | FFh | FFh | FFh | FFh | 0 | erase | 0 |
|  | 00h | FFh | FFh | FFh | 1 | program |  |
|  | 00h | 00h | FFh | FFh | 2 |  |  |
|  | 00h | 00h | 00h | FFh | 3 |  |  |
|  | 00h | 00h | 00h | 00h | 4 |  | 1 |

Figure 4:
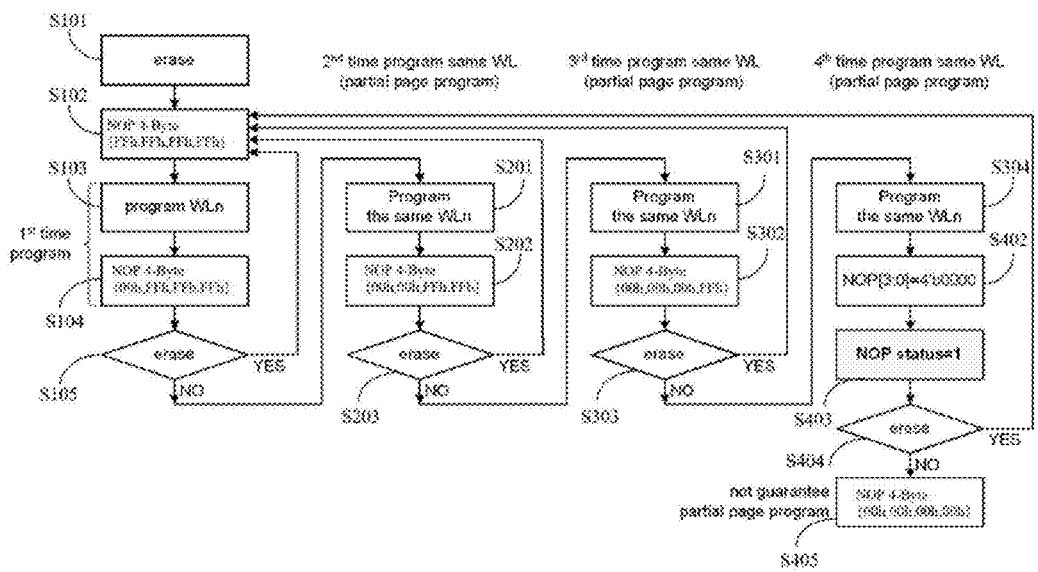
FIG. 4 is a flow chart showing the change of NOP status according to an embodiment of the present invention.

FIG. 4 is a flow chart showing the change of NOP status according to an embodiment of the present invention. As shown in FIG. 4, in step S101, an erase operation is performed, and in step S102 the four-byte NOP columns are 1,1,1,1. Then in step S103, a command is received to program the wordline (WLn), and then in step S104 the outputted four-byte columns are changed to 1,1,1,0. Then, a determination of whether to erase data in the NOP columns in step S105 performed. If yes, step S105 is switched to step S102, and if no, Step S201 is performed to program the same WLn, and the outputted four-byte columns are changed to 1,1,0,0 in step S202. In step S203, a determination of whether to erase data in the NOP columns. If yes, step S203 is switched to step S102, and if no, Step S301 is performed to program the same WLn, and the outputted four-byte columns are changed to 1,0,0,0 in step S302. In step S303, a determination of whether to erase data in the NOP columns. If yes, step S303 is switched to step S102, and if no, Step S401 is performed to program the same WLn, and the outputted four-byte columns are changed to 0,0,0,0 in step S402. Then, in step S403, the NOP status is set to be 1, and a determination of whether to erase data in the NOP columns in step S404 is performed. If yes, step S403 is switched to step S102, and if no, as the outputted four-byte columns are 0,0,0,0, it is not capable to guarantee the correction of partial page pro am. It is capable to warn the user not to program the wordline (WLn) in the user interface or forbit the program of wordline (WLn).

As mentioned above, the present disclosure proposed a method for indicating program state of a wordline performing program operation to a wordline. The method comprises: performing program operation to a wordline; programming one of a plurality of NOP bytes after the wordline is programmed for one time; outputting a NOP status in case that all the plurality of NOP bytes are programmed. If there is an erase operation, the NOP status is set to 0. When all the plurality of NOP bytes are programmed, the NOP status indicating whether the wordline is programmable is changed from 0 to 1. When the NOP status turned to 1, it is not capable to guarantee the correction of partial page program. Therefore, it is capable to warn the user not to program the wordline (WLn) in the user interface or forbit the program of wordline (WLn).

As discussed above, the present invention discloses a method to limit end users to program a wordline by counting the program numbers, in order to prevent the error occurred due to over-time programming the same wordline.

Many details are discussed in the specification provided herein. However, it should be understood that the embodiments of the disclosure may be implemented without these specific details. In some examples, the well-known methods, structures and technologies are not shown in detail so as to avoid an unclear understanding of the description.

It should be noted that the above-described embodiments are intended to illustrate but not to limit the present application, and alternative embodiments may be devised by the person skilled in the art without departing from the scope of claims as appended. In the claims, any reference symbols between brackets form no limit of the claims. The wording "include" does not exclude the presence of elements or steps not listed in a claim. The wording "a" or "an" in front of an element does not exclude the presence of a plurality of such elements. The disclosure may be realized by means of hardware comprising a number of different components and by means of a suitably programmed computer. In the unit claim listing a plurality of devices, some of these devices may be embodied in the same hardware. The wordings "first", "second", and "third", etc. do not denote any order. These wordings may be interpreted as a name.

Also, it should be noticed that the language used in the present specification is chosen for the purpose of readability and teaching, rather than explaining or defining the subject matter of the present application. Therefore, it is obvious for an ordinary skilled person in the art that modifications and variations could be made without departing from the scope and spirit of the claims as appended. For the scope of the present application, the publication of the inventive disclosure is illustrative rather than restrictive, and the scope of the present application is defined by the appended claims.

What is claimed is:

1. A NAND flash memory, comprising:
a wordline comprising a plurality of columns, wherein the plurality of columns comprise a plurality of NOP columns, which are used to store a plurality of NOP bytes;
wherein one of the plurality of NOP bytes is programmed after the wordline is programmed for one time; and
wherein when all the plurality of NOP bytes are programmed, a NOP status indicating whether the wordline is programmable is changed from 0 to 1.

2. The NAND flash memory according to claim 1, wherein the plurality of NOP bytes are four bytes, each of the plurality of column stores one byte of the plurality of NOP bytes.

3. The NAND flash memory according to claim 1, wherein the plurality of columns further comprise a plurality of main columns, a plurality of ECC columns and a plurality of redundant columns.

4. The NAND flash memory according to claim 1, wherein the NOP status is set to 0 after an erase operation.

5. A method for indicating program state of a wordline, comprising:

performing program operation to a wordline; and programming one of a plurality of NOP bytes after the wordline is programmed for one time;

outputting a NOP status in cases that all the plurality of NOP bytes are programmed, wherein the plurality of NOP bytes are four bytes, each of a plurality of column stores one byte of the plurality of NOP bytes;

wherein when all the plurality of NOP bytes are programmed, a NOP status indicating whether the wordline is programmable is changed from 0 to 1.

6. The method according to claim 5, wherein the plurality of columns further comprise a plurality of main columns, a plurality of ECC columns and a plurality of redundant columns.

7. The method according to claim 5, wherein the NOP status is set to 0 after an erase operation.

* * * * *